United States Patent
Rapoport et al.

(10) Patent No.: US 10,224,135 B2
(45) Date of Patent: Mar. 5, 2019

(54) DEVICE, SYSTEM AND METHOD FOR OBTAINING A MAGNETIC MEASUREMENT WITH PERMANENT MAGNETS

(71) Applicant: Aspect Imaging Ltd., Shoham (IL)

(72) Inventors: Uri Rapoport, Moshav Ben Shemen (IL); Yair Goldfarb, Ness Ziona (IL); Yoram Cohen, Yarkona (IL)

(73) Assignee: ASPECT IMAGING LTD., Shoham (IL)

( * ) Notice: Subject to any disclaimer, the term of this patent is extended or adjusted under 35 U.S.C. 154(b) by 126 days.

(21) Appl. No.: 15/402,438

(22) Filed: Jan. 10, 2017

(65) Prior Publication Data

US 2018/0040406 A1 Feb. 8, 2018

Related U.S. Application Data

(60) Provisional application No. 62/372,065, filed on Aug. 8, 2016, provisional application No. 62/381,079, filed on Aug. 30, 2016.

(51) Int. Cl.
*G01V 3/00* (2006.01)
*H01F 7/02* (2006.01)
*G01R 33/383* (2006.01)
*G01R 33/3873* (2006.01)
*G01R 33/421* (2006.01)

(52) U.S. Cl.
CPC ......... *H01F 7/0278* (2013.01); *G01R 33/383* (2013.01); *G01R 33/3873* (2013.01); *G01R 33/421* (2013.01)

(58) Field of Classification Search
USPC ......................................................... 324/309
See application file for complete search history.

(56) References Cited

U.S. PATENT DOCUMENTS

| | | | |
|---|---|---|---|
| 3,534,251 A | 10/1970 | Richards | |
| 4,612,505 A | 9/1986 | Zijlstra | |
| 4,698,611 A | 10/1987 | Vermilyea | |
| 4,758,813 A | 7/1988 | Holsinger et al. | |
| 4,899,109 A | 2/1990 | Tropp et al. | |

(Continued)

FOREIGN PATENT DOCUMENTS

| | | |
|---|---|---|
| CN | 102136337 | 7/2011 |
| EP | 0921527 | 6/1999 |

(Continued)

OTHER PUBLICATIONS

Liming Hong and Donglin Zu, Shimming Permanent Magnet of MRI Scanner, Piers Online, 2007, vol. 3, No. 6, 859-864.

(Continued)

*Primary Examiner* — Rodney E Fuller
(74) *Attorney, Agent, or Firm* — Pearl Cohen Zedek Latzer Baratz LLP

(57) ABSTRACT

A magnetic field device, with a first magnet, a first ferromagnetic element positioned adjacent to the first magnet, a second magnet, a second ferromagnetic element positioned adjacent to the second magnet and relative to the first ferromagnetic element to create a gap between the first ferromagnetic element and the second ferromagnetic element, and a third magnet positioned between the first ferromagnetic element and the second ferromagnetic element and within the gap.

18 Claims, 11 Drawing Sheets

(56) References Cited

U.S. PATENT DOCUMENTS

| | | | |
|---|---|---|---|
| 4,931,733 A | 6/1990 | Hanawa | |
| 5,235,284 A | 8/1993 | Tahara et al. | |
| 5,343,151 A | 8/1994 | Gory et al. | |
| 5,359,310 A | 10/1994 | Pissanetzky | |
| 5,539,316 A | 7/1996 | Sukumar | |
| 5,565,834 A * | 10/1996 | Hanley | G01R 33/383 324/319 |
| 5,635,889 A | 6/1997 | Stelter | |
| 5,664,569 A | 9/1997 | Damadian et al. | |
| 5,760,585 A | 6/1998 | Dorri | |
| 6,081,120 A | 6/2000 | Shen | |
| 6,147,578 A | 11/2000 | Panfil et al. | |
| 6,157,278 A | 12/2000 | Katznelson et al. | |
| 6,177,795 B1 | 1/2001 | Zhu et al. | |
| 6,191,584 B1 * | 2/2001 | Trequattrini | G01R 33/383 324/319 |
| 6,411,187 B1 | 6/2002 | Rotem et al. | |
| 6,452,388 B1 | 9/2002 | Reiderman et al. | |
| 6,535,092 B1 | 3/2003 | Hurley et al. | |
| 6,600,401 B2 | 7/2003 | Zuk et al. | |
| 6,646,530 B2 * | 11/2003 | Ruhrig | B82Y 25/00 335/306 |
| 6,687,526 B2 | 2/2004 | Brand et al. | |
| 6,707,363 B1 | 3/2004 | Abele | |
| 6,751,496 B2 | 6/2004 | Su et al. | |
| 6,838,964 B1 | 1/2005 | Knight et al. | |
| 6,897,750 B2 | 5/2005 | Neuberth | |
| 6,946,939 B2 | 9/2005 | Doi | |
| 7,034,530 B2 | 4/2006 | Ahluwalia et al. | |
| 7,116,198 B1 | 10/2006 | Abele | |
| 7,148,689 B2 | 12/2006 | Huang et al. | |
| 7,205,764 B1 | 4/2007 | Anderson et al. | |
| 7,400,147 B2 | 7/2008 | Rapoport | |
| 7,423,431 B2 | 9/2008 | Amm et al. | |
| 7,529,575 B2 | 5/2009 | Rezzonico et al. | |
| 7,551,954 B2 | 6/2009 | Green et al. | |
| 7,800,368 B2 | 9/2010 | Vaughan et al. | |
| 8,089,281 B2 | 1/2012 | Zhai et al. | |
| 8,319,496 B2 | 11/2012 | Eryaman et al. | |
| 8,896,310 B2 | 11/2014 | Rapoport | |
| 8,969,829 B2 | 3/2015 | Wollenweber et al. | |
| 9,100,111 B2 | 8/2015 | Behrendt et al. | |
| 9,157,975 B2 | 10/2015 | Dale | |
| 9,159,479 B2 | 10/2015 | Rotem | |
| 9,696,269 B2 * | 7/2017 | Fordham | G01N 24/081 |
| 2001/0013779 A1 | 8/2001 | Marek | |
| 2002/0050895 A1 | 5/2002 | Zuk et al. | |
| 2005/0030028 A1 | 2/2005 | Clarke et al. | |
| 2005/0043612 A1 | 2/2005 | Saint-Jalmes et al. | |
| 2007/0068862 A1 | 3/2007 | Sisemore | |
| 2007/0096737 A1 | 5/2007 | Rapoport | |
| 2007/0108850 A1 * | 5/2007 | Chertok | H02K 1/145 310/15 |
| 2007/0249928 A1 | 10/2007 | Blezek et al. | |
| 2007/0265520 A1 | 11/2007 | Posse | |
| 2007/0273378 A1 | 11/2007 | Trequattrini et al. | |
| 2008/0001601 A1 | 1/2008 | Sellers et al. | |
| 2008/0246476 A1 | 10/2008 | Rapoport | |
| 2009/0072939 A1 * | 3/2009 | Shen | G01R 33/3806 335/306 |
| 2009/0085700 A1 * | 4/2009 | Lian | G01R 33/3806 335/302 |
| 2009/0120615 A1 | 5/2009 | Icoz et al. | |
| 2009/0259560 A1 | 10/2009 | Bachenheimer | |
| 2012/0119742 A1 | 5/2012 | Rapoport | |
| 2014/0257081 A1 | 9/2014 | Rapoport | |
| 2015/0059157 A1 | 3/2015 | Rapoport | |
| 2015/0137812 A1 | 5/2015 | Rapoport | |
| 2015/0168519 A1 | 6/2015 | Rapoport | |
| 2015/0253397 A1 | 9/2015 | Rapoport | |
| 2015/0253400 A1 | 9/2015 | Rapoport | |
| 2015/0253401 A1 | 9/2015 | Rapoport | |
| 2016/0022123 A1 | 1/2016 | Katznelson et al. | |

FOREIGN PATENT DOCUMENTS

| | | |
|---|---|---|
| GB | 863272 | 3/1961 |
| WO | WO2007/052275 | 5/2007 |
| WO | WO2011/001429 | 1/2011 |
| WO | WO2014/141251 | 9/2014 |

OTHER PUBLICATIONS

Yingying Yao, Yong-Kwon Choi and Chang-Seop Koh, The Optimal Design of Passive Shimming Elements for High Homogenous Permanent Magnets Utilizing Sensitivity Analysis, Journal of Electrical Engineering & Technology, 2006, vol. I, No. 4, pp. 461-465.

Z. Ren, D. Xie, and H. Li, Study on Shimming Method for Open Permanent Magnet of MRI, Progress in Electromagnetics Research M, 2009, vol. 6, 23-34.

Keith Wachowicz, Evaluation of Active and Passive Shimming in Magnetic Resonance Imaging, Research and Reports in Nuclear Medicine, 2014:4 1-12.

R Prost and L F Czervionke, How does an MR scanner operate? American Journal of Neuroradiology, Aug. 1994, 15 (7) 1383-1386.

Belov, A. et al. Passive Shimming of the Superconducting Magnet for MRI, IEEE Transactions on Applied Superconductivity, Jun. 1995, vol. 5, No. 2, 679-681.

McGinley et al., A permanent MRI magnet for magic angle imaging having its field parallel to the poles, Journal of Magnetic Resonance, 2016, 271; 60-67.

* cited by examiner

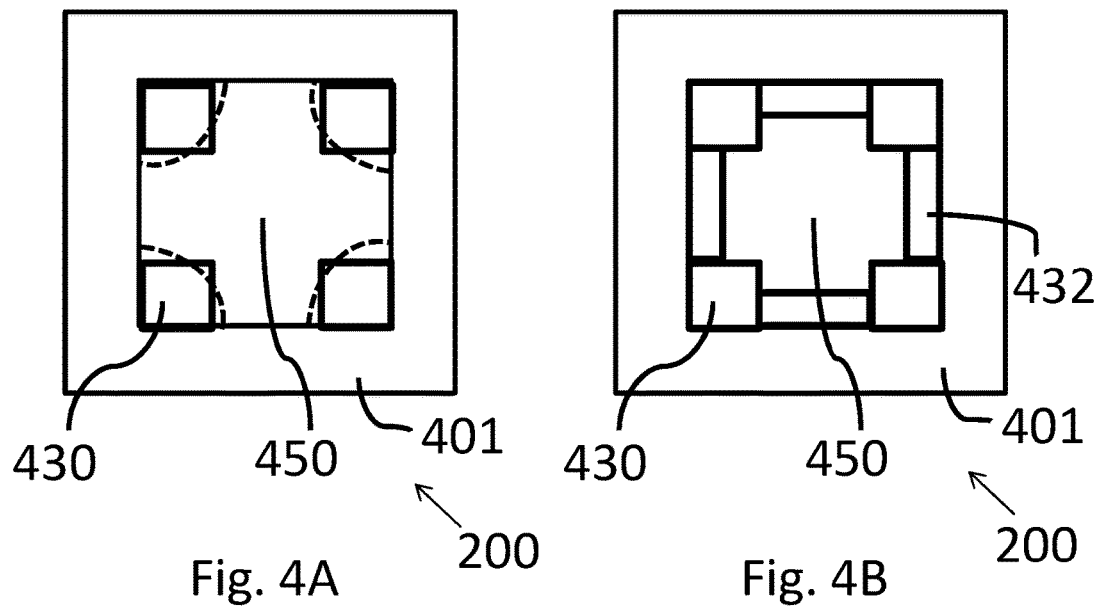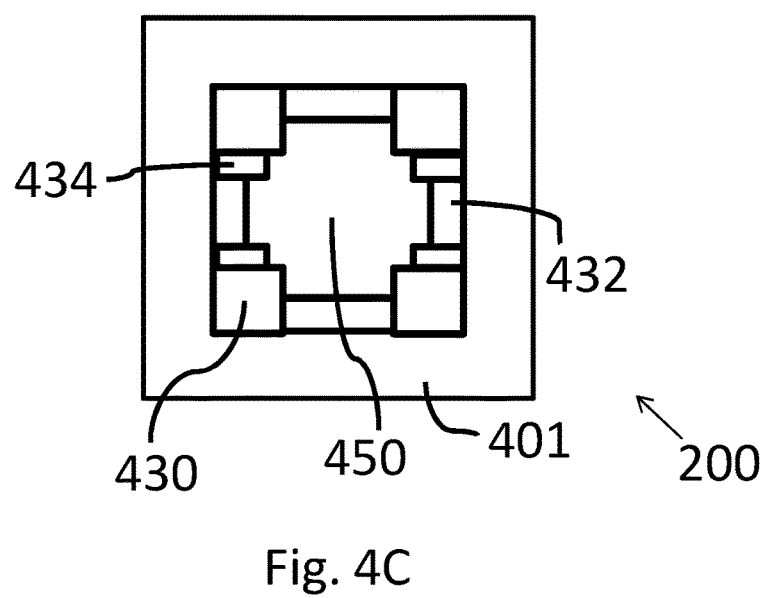

DEVICE, SYSTEM AND METHOD FOR OBTAINING A MAGNETIC MEASUREMENT WITH PERMANENT MAGNETS

CROSS-REFERENCE TO RELATED APPLICATIONS

This application claims the benefit of U.S. Provisional Patent Applications 62/372,065 filed on Aug. 8, 2016 entitled "DEVICE, SYSTEM AND METHOD FOR OBTAINING A MAGNETIC MEASUREMENT WITH PERMANENT MAGNETS" and U.S. Provisional Patent Application 62/381,079 filed on Aug. 30, 2016 entitled "NMR/MRI MAGNET ASSEMBLY COMPRISING SUPERCONDUCTING COILS AND A FERROMAGNETIC POLE PIECE", incorporated herein by reference in its entirety.

FIELD OF THE INVENTION

Generally, the present invention relates to magnetic devices. More particularly, the present invention relates to devices, systems and methods for obtaining magnetic measurements.

BACKGROUND OF THE INVENTION

Electromagnetic based instruments can be used for measuring properties of matter and/or used for identifying its composition. For example, an electromagnetic based instrument capable of performing magnetic resonance spectroscopy can be used to obtain physical, chemical and/or structural information about matter (e.g., a molecule). Typically, in order to perform magnetic resonance spectroscopy, for example to provide high quality measurements of an object/subject (e.g., high resolution image and/or image contrast), it can be desirable for the magnetic field inside of a zone of measurement (e.g., an area where an object is to be measured is positioned) to be substantially stable and/or uniform. Other applications (e.g., magnetic resonance imaging (MRI)) can also require a high, stable, and/or uniform magnetic field strength.

Some systems that use magnetic fields for measurements can include magnetic coils to create the magnetic fields, with application of current to the coil, while other systems can utilize permanent magnets to create the magnetic fields, which typically do not require application of a current.

One difficulty in creating a magnetic field in a zone of measurement with permanent magnet(s) that is sufficient for magnetic resonance spectroscopy and/or magnetic imaging (e.g., that is substantially stable and/or uniform) is that magnetic fields produced by the permanent magnets(s) can be non-homogeneous, thus typically resulting in a non-homogenous magnetic field within the zone of measurement.

Some current solutions for creating a homogenous and/or stable magnetic field within a zone of measurement using a permanent magnet can include adding additional elements to an imaging device (e.g., coils) and/or increasing the size of the permanent magnets. One difficulty with current solutions is that as the number of elements in a magnetic measurement device increases and/or the size of the permanent magnets increases, the weight, size and/or cost of the device can increase.

Another difficulty with current solutions is that a magnetic measurement device that is heavy can cause a lack of mobility. For example, for magnetic measurement devices in a hospital setting (e.g., magnetic resonance imaging (MRI) devices), a heavy and/or large device can prevent hospital personnel from moving an MRI. This can cause further difficulties, when imaging patients that can be hard to move (e.g., patients that are hooked up to multiple life support and/or monitoring equipment).

In another example, for magnetic measurement devices in an industrial setting (e.g., nuclear magnetic measurement (NMR) devices that measure properties of fluids and/or drilling muds in oil production facilities), a heavy and/or large device can prevent personnel from measuring the fluids/muds at various locations in the processes.

Therefore it can be desirable to achieve a desired magnetic field strength, having sufficient homogeneity and/or stability, and/or reducing a total weight of a magnetic measurement system.

SUMMARY OF THE INVENTION

There is thus provided, in accordance with some embodiments of the invention, a magnetic field device, including a first magnet, a first ferromagnetic element positioned adjacent to the first magnet, a second magnet, a second ferromagnetic element positioned adjacent to the second magnet and relative to the first ferromagnetic element to create a gap between the first ferromagnetic element and the second ferromagnetic element, and a third magnet positioned between the first ferromagnetic element and the second ferromagnetic element and within the gap.

In some embodiments, the third magnet has a first surface that faces a first surface of the first ferromagnetic element and a second surface that faces a first surface of the second ferromagnetic element. In some embodiments, the first surface of the third magnet abuts the first surface of the first ferromagnetic element and the second surface of the third magnet abuts the first surface of the first ferromagnetic element. In some embodiments, the third magnet has a dimension that allows the third magnet to translate between a first position and a second position, the first position being the first surface of the first ferromagnetic element, the second position being the first surface of the second ferromagnetic element In some embodiments, the magnetic field device further includes a fourth magnet positioned between the first ferromagnetic element and the second ferromagnetic element and within the gap. In some embodiments, the fourth magnet has a first surface that faces a first surface of the first ferromagnetic element and a second surface that faces a first surface of the second ferromagnetic element. In some embodiments, the fourth magnet has a dimension that allows the fourth magnet to translate between a first position and a second position, the first position being the first surface of the first ferromagnetic element, the second position being the first surface of the second ferromagnetic element.

In some embodiments, the first magnet, the second magnet and the third magnet are permanent magnets, superconducting magnets, or resistive magnets. In some embodiments, the first magnet, the second magnet and the third magnet have dimensions that are based on a desired magnetic field strength, a type of object to be imaged, or any combination thereof. In some embodiments, the first magnet, the second magnet and the third magnet has a length between 10 and 1100 millimeters, a width between 10 and 300 millimeters, and a height between 45 and 200 millimeters.

In some embodiments, the gap has dimensions that are based on a type of object to be imaged. In some embodiments, the gap has a diameter of 190 millimeters. In some embodiments, the magnetic field device further includes at least one fifth magnet coupled to the first magnet.

In some embodiments, the third magnet is positioned to cause a decrease of a magnetic field that is peripheral to the magnetic field device. In some embodiments, a first axis of the magnetic field device is defined as passing from the first ferromagnetic element to the second ferromagnetic element, wherein the first magnet and the second magnet are positioned to cause a magnetic field with a magnetization direction along the first axis, and wherein the third magnet is positioned to cause a magnetic field with a magnetization direction along the first axis.

In some embodiments, the magnetization direction of the third magnet is opposite of the magnetization direction of the first magnet. In some embodiments, the magnetic field device is positioned within an outer shell, the outer shell including a metal alloy. In some embodiments, at least one of the first and second magnets emits a magnetic field with a predetermined magnetic field strength, wherein the third magnet emits a magnetic field with a predetermined magnetic field strength, and wherein the strength of the magnetic field of at least one of the first and second magnets is substantially greater than the strength of the magnetic field of the third magnet. In some embodiments the total magnetic field produced during operation of the magnetic field device is substantially homogeneous and uniform within the gap There is thus provided, in accordance with some embodiments of the invention, a method of directing magnetic fields into a measurement volume, the method including generating a first magnetic field in a first direction with a first magnetic field strength, distributing the first magnetic field into the measurement volume to create a substantially uniform magnetic flux, and increasing a total magnetic flux into the measurement volume by directing a second magnetic field in a second direction with a second magnetic field strength, wherein the second direction is parallel to the first direction.

In some embodiments, the method further includes directing a third magnetic field into the measurement volume in a third direction, wherein the third direction is perpendicular to the first direction. In some embodiments, the method further includes positioning an object within the measurement volume, and performing magnetic field analysis on the object.

In some embodiments, at least one of the first magnetic field strength, and the second magnetic field strength is between 0.5 and 1.5 Tesla. In some embodiments, the first magnetic field strength and the first direction, and the second magnetic field strength and the second direction are based on a size of the measurement volume, a type of object to be measured, or any combination thereof. In some embodiments, the total magnetic flux in the measurement volume is a substantially homogeneous field.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, can be understood by reference to the following detailed description when read with the accompanying drawings in which:

FIGS. 4A-4H schematically illustrate top cross-sectional views of various magnetic field devices, according to illustrative embodiments of the invention;

Figure 1A:
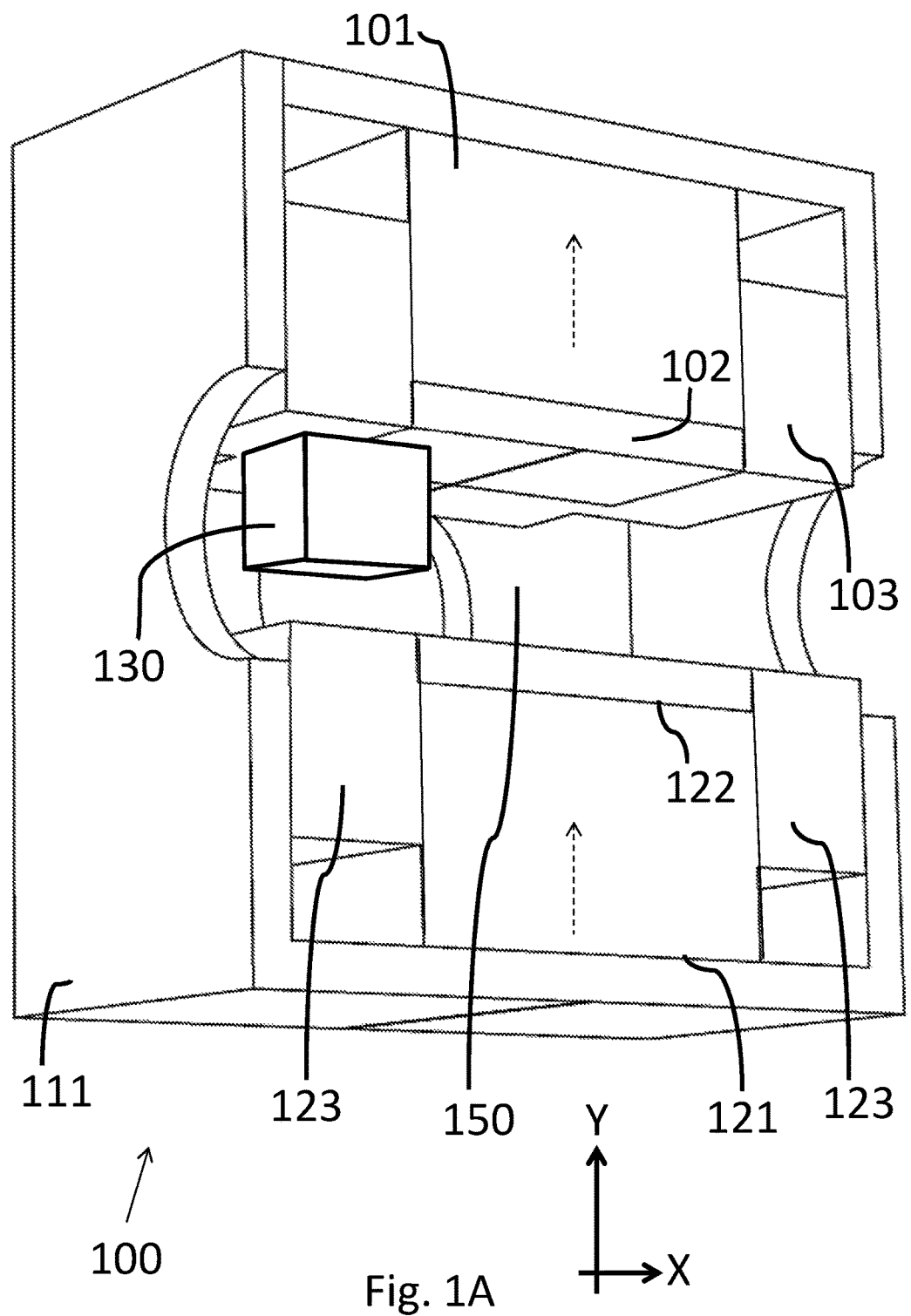
FIG. 1A schematically illustrates a perspective cross-sectional view of a magnetic field device, according to illustrative embodiments of the invention.

It will be appreciated that for simplicity and clarity of illustration, elements shown in the figures have not necessarily been drawn to scale. For example, the dimensions of some of the elements can be exaggerated relative to other elements for clarity. Further, where considered appropriate, reference numerals can be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention can be practiced without these specific details. In other instances, well-known methods, procedures, and components have not been described in detail so as not to obscure the present invention.

FIG. 1A schematically illustrates a cross-sectional perspective view of a magnetic field device 100, according to illustrative embodiments of the invention. The magnetic field device 100 can include an outer shell 111, a first magnet 101 (e.g., a first permanent magnet), a first ferromagnetic element 102 (e.g., a first pole piece), and a second magnet 121 (e.g., a second permanent magnet) and a second ferromagnetic element 122 (e.g., a second pole piece). In some embodiments, first magnet 101 and first ferromagnetic element 102 and/or second magnet 121 and second ferromagnetic element 122 can be grouped together as a single unit (e.g., as an assembly).

The first ferromagnetic element 102 can be coupled to and/or positioned adjacent to the first magnet 101. The second ferromagnetic element 122 can be coupled to and/or positioned adjacent to the second magnet 121. In some embodiments, the magnetic field device 100 can include a third magnet 130, positioned between the first ferromagnetic element 102 and the second ferromagnetic element 122.

The first and second ferromagnetic elements 102, 122 can be coupled and positioned adjacent to a corresponding first and second magnets 101, 121 such that the first and second ferromagnetic elements 102, 122 can be proximal to a gap 150 (e.g., zone of measurement) of the magnetic field device 100. The first magnet 101 and the second magnet 121 can be distal to the gap 150 of the magnetic field device 100. The magnetization direction of the first magnet 101 can be parallel to the magnetization direction of the second magnet 121, along the second axis (indicated "X" in FIG. 1A), where the first and second ferromagnetic elements 102, 122 can face each other with the gap 150 created therebetween.

In various embodiments, dimensions of the gap 150 (and thus positioning on of the elements 102, 122, 101, 121) can depend on a subject/object to be measured. For example, if the subject to be measured is an adult human head gap 150 can have dimensions that comfortably fit an adult human head. In another example, if the subject to measured is a mouse, gap 150 can fit the mouse. It is apparent to one of ordinary skill that other objects/subjects can be measured, and that these are examples.

Figure 1B:
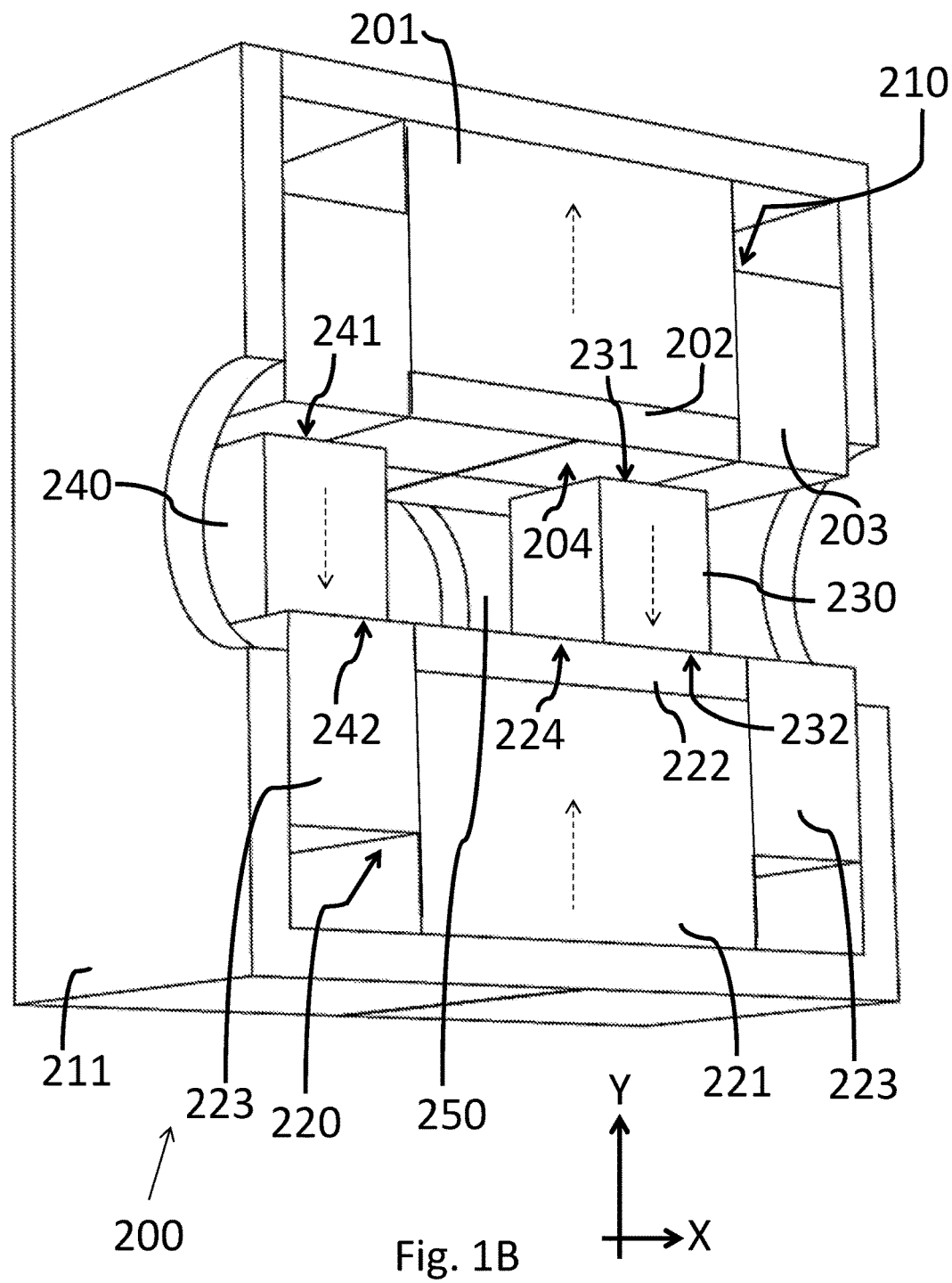
FIG. 1B schematically illustrates a perspective cross-sectional view of a magnetic field device having additional magnets to the device of FIG. 1A, according to illustrative embodiments of the invention.

FIG. 1B schematically illustrates a cross-sectional perspective view of a magnetic field device 200, having additional magnets to the device of FIG. 1A, according to illustrative embodiments of the invention. The magnetic field device 200 can include an outer shell 211, a first magnet 201, a first ferromagnetic element 202 (e.g., a first pole piece), a second magnet 221, a third magnet 230, a fourth magnet 240, a first ferromagnetic element 202, and a second ferromagnetic element 222 (e.g., a second pole piece). The first ferromagnetic element 202 can be coupled to and/or positioned adjacent to the first magnet 201. The second ferromagnetic element 222 can be coupled to and/or positioned adjacent to the second magnet 221.

In some embodiments, the magnetic field device 200 can include additional magnets such as magnets 103, 123 in FIG. 1A or magnets 203, 223 in FIG. 1B. In some embodiments, magnets 103, 123 in FIG. 1A are not present.

The first and second ferromagnetic elements 202, 222 can be coupled to and positioned adjacent to its corresponding first and second magnets 201, 221 such that the first and second ferromagnetic elements 202, 222 can be proximal to a gap 250 (e.g., zone of measurement) of the magnetic field device 200. The first magnet 201 and the second magnet 221 can be distal to the gap 250 of the magnetic field device 200. The magnetization direction of the first magnet 201 can be parallel to the magnetization direction of the second magnet 221, along the second axis (indicated "X" in FIG. 1B), where the first and second ferromagnetic elements 202, 222 can face each other with the gap 250 created therebetween.

The third magnet 230 can be coupled to and can be positioned between the first ferromagnetic element 202 and the second ferromagnetic element 222.

The third magnet 230 can have a first surface 231 that faces a first surface 204 of the first ferromagnetic element 202 and a second surface 232 that faces a first surface 224 of the second ferromagnetic element 222. The first surface 231 of the third magnet 230 can abut the first surface 204 of the first ferromagnetic element 202 and the second surface 232 of the third magnet 230 can abut the first surface 224 of the second ferromagnetic element 222. In some embodiments, the third magnet 230 can have a dimension that allows the third magnet 230 to translate between a first position and a second position, the first position being the first surface 204 of the first ferromagnetic element 202, the second position being the first surface 224 of the second ferromagnetic element 222.

The fourth magnet 240 can be positioned between the first ferromagnetic element 202 and the second ferromagnetic element 222 and within the gap 250. The fourth magnet 240 can have a first surface 241 that faces the first surface 204 of the first ferromagnetic element 202 and a second surface 242 that faces the first surface 224 of the second ferromagnetic element 222. The fourth magnet 240 can have a dimension that allows the fourth magnet 240 to translate between a first position and a second position, the first position being the first surface 204 of the first ferromagnetic element 202, the second position being the first surface 224 of the second ferromagnetic element 222.

As is apparent to one of ordinary skill in the art, while magnetic gradient coils (creating a magnetic field with application of current) can be utilized in the gap to provide a magnetic gradient, an embodiment of the invention uses permanent magnets that have no need for magnetic gradient coils.

In some embodiments, the first magnet 201, the second magnet 221 and the third magnet 230 are permanent magnets and/or superconducting magnets and/or resistive magnets. The first magnet 201, the second magnet 221 and the third magnet 230 can have dimensions that are based on a desired magnetic field strength, a type of object to be imaged, or any combination thereof.

In some embodiments, at least one of the first magnet 201, the second magnet 221 and the third magnet 230 has a length between 10 and 1100 millimeters, a width between 10 and 300 millimeters, and a height between 45 and 200 millimeters.

Each of the magnets of magnetic field device 200 has a direction of magnetization and creates a magnetic field. The dashed arrows in FIG. 1B indicate a direction of the magnetization of the particular magnet the arrow is displayed on.

The first magnet 201 and second magnet 221 can have the same magnetization direction along a first axis (indicated "Y" in FIG. 1B), for example a transverse axis of the magnetic field device 200.

The magnetization direction of the third magnet 230 can be opposite to the magnetization direction of the first and second magnets 201, 221 for instance along the first axis (indicated "Y" in FIG. 1B).

In some embodiments, the first ferromagnetic element 202 and the second ferromagnetic element 222 can extend and can direct the magnetic field produced by the corresponding first magnet 201 and second magnet 221, and/or reduce noise from outside of the magnetic field device 200.

Figure 2A:
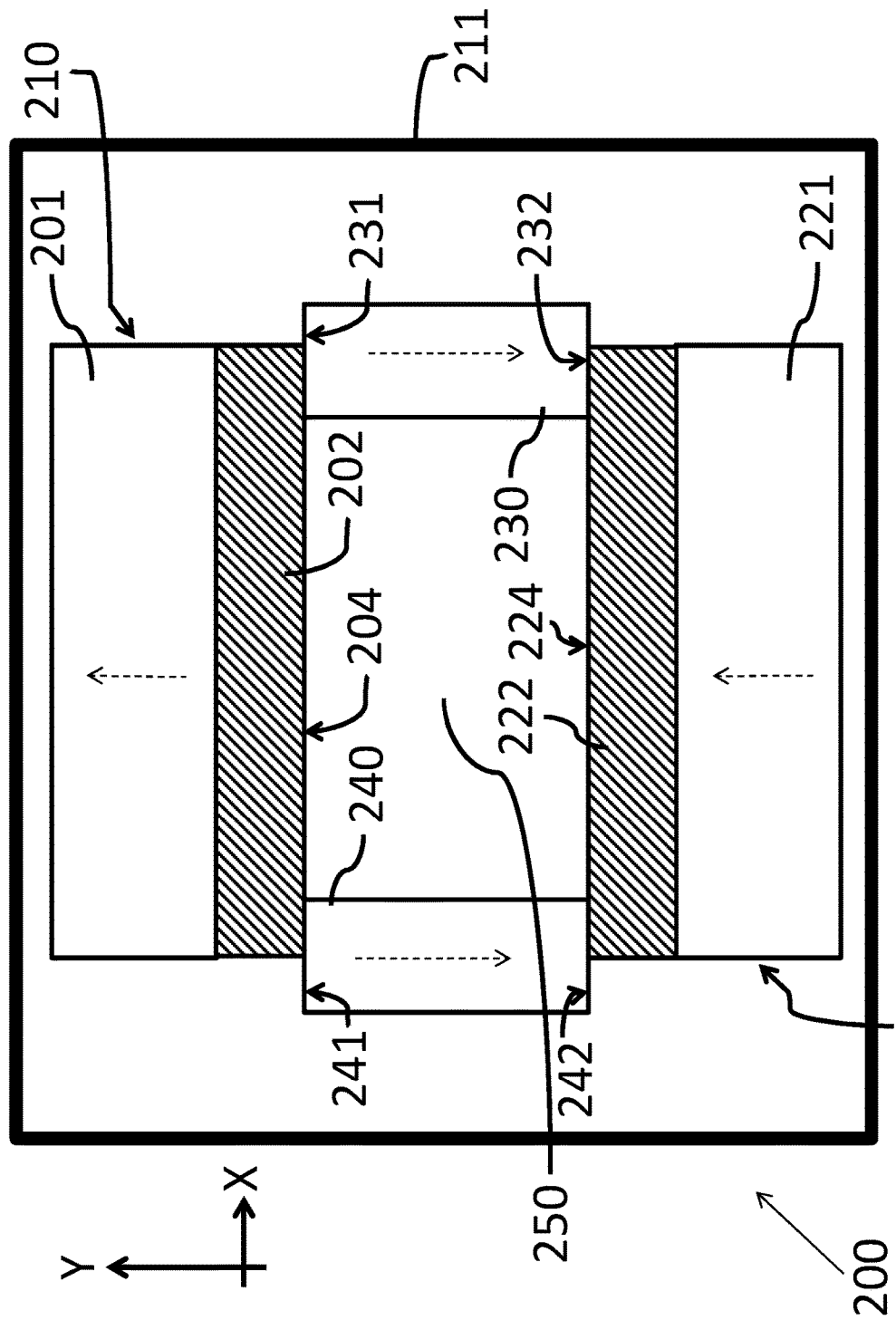
FIG. 2A schematically illustrates a frontal cross-sectional view of the magnetic field device, according to illustrative embodiments of the invention.
Figure 2B:
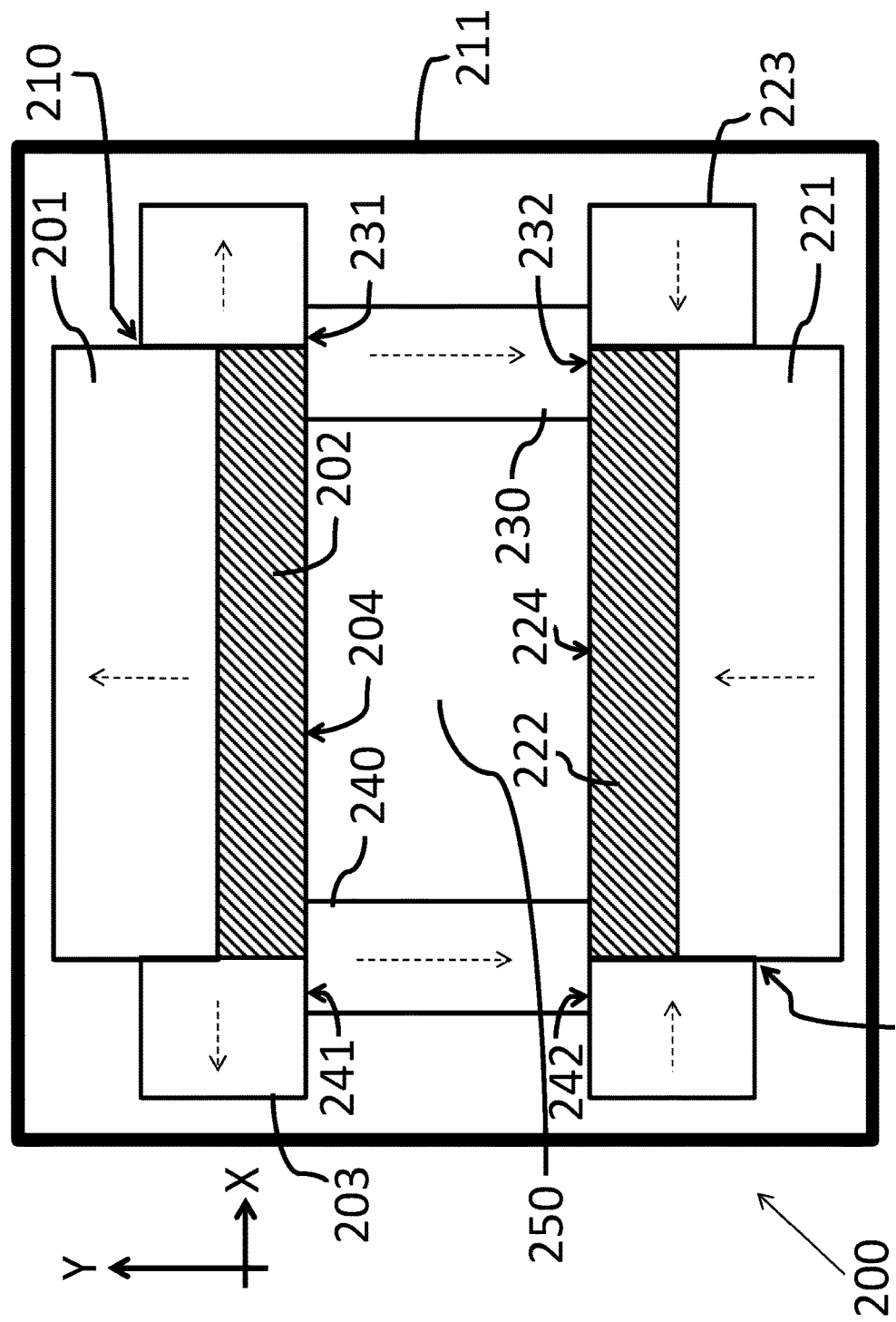
FIG. 2B schematically illustrates a frontal cross-sectional view of the magnetic field device, with additional magnets, according to illustrative embodiments of the invention

FIG. 2A schematically illustrates a frontal cross-sectional view of the magnetic field device 200, according to illustrative embodiments of the invention. FIG. 2B schematically illustrates a frontal cross-sectional view of the magnetic field device 200, with additional magnets, according to illustrative embodiments of the invention.

In some embodiments, the magnetic field device 200 can include additional magnets. For example, turning to FIG. 2B, the magnetic field device 200 can include a fifth magnet 203, and a sixth magnet 223. In some embodiments at least one of fifth magnet 203 and sixth magnet 223 is a permanent magnet.

In some embodiments, the magnetic field device 200 can include additional magnets 203, 223 while the third magnet 230 can be coupled to the first and second ferromagnetic elements 202, 222.

In various embodiments, the fifth and sixth magnets 203, 223 are positioned around the first and second magnets 201, 221, respectively, for instance the sixth magnet 223 can be positioned around the second magnet 221.

The fifth and sixth magnets 203, 223 can have a magnetization direction perpendicular to the magnetization direction of the first magnets 201 along a second axis (indicated "X" in FIG. 2B) perpendicular to the first axis, for example a longitudinal axis of the magnetic field device 200. According to some embodiments, the magnetization direction of the at least one fifth magnet 203 can be away from the first magnet 201, and the magnetization direction of the at least one sixth magnet 223 can be towards the second magnet 221.

As is apparent to one of ordinary skill in the art, additional magnets can be included in the magnetic field device 200. For example, in some embodiments, additional third magnets, fifth magnets and/or first magnets can be used.

In some embodiments, the outer shell 211 can include a metal alloy, and can allow confining (or substantially confining) the magnetic field created by the magnets of magnetic field device 200 within the outer shell 211. In this manner, the existence of a magnetic field outside of the outer shell 211 can be zero and/or negligible. For example, if a device that is susceptible to the effects of a magnetic field (e.g., cell phone, pacemaker, etc.) is positioned adjacent to the outer shell 211 outside of the device 200, the magnetic field in that location can have a negligible effect on the device. In some embodiments, outer shell 211 can also have an opening so as to provide access to the gap 250.

In various embodiments, the third magnet 230 and/or the fourth magnet 240 can have a hollow structure and surround the gap 250 between the first and second ferromagnetic elements 202, 222. In various embodiments, the third magnet 230 and/or the fourth magnet 240 can be provided in a variety of shapes and sized, for instance cylindrical or triangular, with varying shape and size.

In case that magnetic field device 200 is utilized for magnetic resonant imaging, additional electromagnetic elements can be included, such as a radio frequency (RF) generator or field sensors. The third magnet 230 can be configured to surround the gap 250 between the first and second ferromagnetic elements 202, 222 in order to for example, prevent radiation leakage from additional electromagnetic elements, for instance RF generator in magnetic resonance devices. For example, third magnet 230 can be in a shape of a hollow cube or a hollow cylinder surrounding gap 250 in order to, for example, prevent radiation leakage from additional electromagnetic elements outside of third magnet 230.

The third magnet 230 can contribute to causing the overall magnetic field to be a homogeneous and/or uniform magnetic field, for magnetic field device 200 in the area of measurement. The third magnet 230 can allow for a reduction of size, weight, and/or magnetic field strength of the first and/or second magnets 201, 221 and/or the fifth and/or sixth magnets 203, 223 due to, for example, the third magnet 230 contributing to the overall magnetic field strength within the gap. A reduction in size of the first and/or second magnets 201, 221 and/or the fifth and/or sixth magnets 203, 223, can allow for a having lower weight of the magnetic field device with substantially the same field strength compared to, for example, a magnetic field device that does not include the third magnet 230.

In some embodiments, magnetic field device 200 includes two fifth magnets 203, and also includes two sixth magnets 223. In these embodiments, the ability to reduce the size of the magnets due to, for example, the third magnet 230 can provide even further weight reduction of the magnetic field device.

In some embodiments, at least one of the first and second magnets 201, 221 emits a magnetic field with a predetermined magnetic field strength, wherein the third magnet 230 can emit a magnetic field with a predetermined magnetic field strength, and wherein the strength of the magnetic field of at least one of the first and second magnets 201, 221 can be substantially greater than the strength of the magnetic field of the third magnet 230.

According to some embodiments, the outer shell 211 can constitute the main bulk of the weight of the magnetic field device 200. Since the addition of the third magnet 230 can reduce weight of other components as well as provide a homogeneous and uniform magnetic field, it can be possible to utilize an outer shell with reduced weight. In some embodiments, a reduction of at least twenty percent can be created for the total weight of the magnetic field device 200 in comparison to, for example, devices that do not have the third magnet. In some embodiments, an increase of at least thirty percent can be created for the magnetic field strength, for example in comparison to, for example, device that do not have the third magnet but have substantially the same total weight of the magnetic field device 200. The third magnet 230 can allow obtaining stronger magnetic fields and/or lower total magnet weight.

In some embodiments, the area of the fringe field can be reduced from the center of the gap, for example for a limit of a field of about 1 Gauss (sometimes referred to as the 1G line) can be reduced at substantially 100 millimeters. Therefore, reduction of fringe field can cause the dimensions of the outer shell 211 to be reduced, for example, from substantially 860×1032 millimeters to substantially 786×894 millimeters. Reduction of the outer shell 211 can accordingly cause a reduction of the total weight of magnetic field device 200.

Overall weight of a magnetic field device can be reduced, and for example an increase of over ten percent for the ratio of magnetic field strength to total weight of at least the combination of the first and second magnets and the at least one third magnet. In some embodiments, an increase in magnetic field caused by the third magnets can be larger than the increase that may be achieved by a corresponding enlargement of the first and second magnets (without a third magnet). This is due to the alignment of the third permanent magnets and also due to the scalability of the weight savings such that addition of magnets can cause a reduction of weight.

In some embodiments, the outer shell 211 can also have a smaller surface area compared to a commercially available magnetic resonance device, due to a reduction in fringe weight of the outer shell and/or due to reduction of the fringe field. Such reduction can occur since the addition of the third magnet 230 can increase magnetic field in the gap 250, between the first and second ferromagnetic elements 202, 222 and therefore reduce the fringe field of the magnetic field device 200 so that there is no longer a need for the outer shell 211 to be at same large weight and large surface area, for example compared to a commercially available magnetic resonance device.

In some embodiments, additional material, for example including Iron, can be added to magnetic field device 200 in order to further confine and manipulate the magnetic field in the gap. In some embodiments, the added material, for example including Iron and/or Titanium, can be added adjacent to at least one magnet 201 and/or adjacent to at least one ferromagnetic element 202.

It may be appreciated that regions of high magnetic flux density causing external fringe fields can occur adjacent to connection of the magnets, e.g., indicated with a dashed line in FIG. 4A. In some embodiments, an outer shell (or envelope), usually including Iron, surrounds the magnetic resonance device to reduce the magnetic flux.

In some embodiments, the third magnet 230 can prevent at least a portion of magnetic flux from exiting a gap (e.g., an area where the magnetic field is directed). Magnetic field device 200 can be utilized in order to provide a strong magnetic field while providing reduced weight of the device, for example utilized for magnetic resonant imaging or for other devices where a strong magnetic field can be required. It may be appreciated that addition of the third magnets can counter the magnetic flux, for example in regions indicated with a dashed line in FIG. 4A, so as to, for example, reduce the fringe fields.

According to some embodiments, an existing magnetic field system that includes two magnets, neither of which includes a third magnet can be modified with insertion of at least one third magnet between the two magnets, in order to, for example, increase the magnetic field within the gap and/or reduce the fringe field. For example, a comparison between three systems: a first system "A" without third magnets, a second system "B" provided with at least one third magnet, and a third system "C" that is modified with the addition of at least one third magnet. In this example, in weight comparison to the first system "A", the second system "B" can have weight reduced at about 5.5%, while the third system "C" can have weight increase at about 6.5%. In this example, in comparison to the first system "A" of field strength in the gap, the second system "B" can have increase of about 15%, and the third system "C" can have increase of about 13%. In this example, in comparison to the first system "A" of fringe field reduction, the second system "B" can have decrease of about 55%, and the third system "C" can have decrease of about 16%. Therefore, in correct positioning of third magnets can provide various advantages to new systems as well as to existing systems that can be modified. It is apparent to one of ordinary skill in the art that the example provided above gives exemplary weight reduction values for explanatory purposes, and that other comparison weight configurations are within the scope of the invention.

Figure 3:
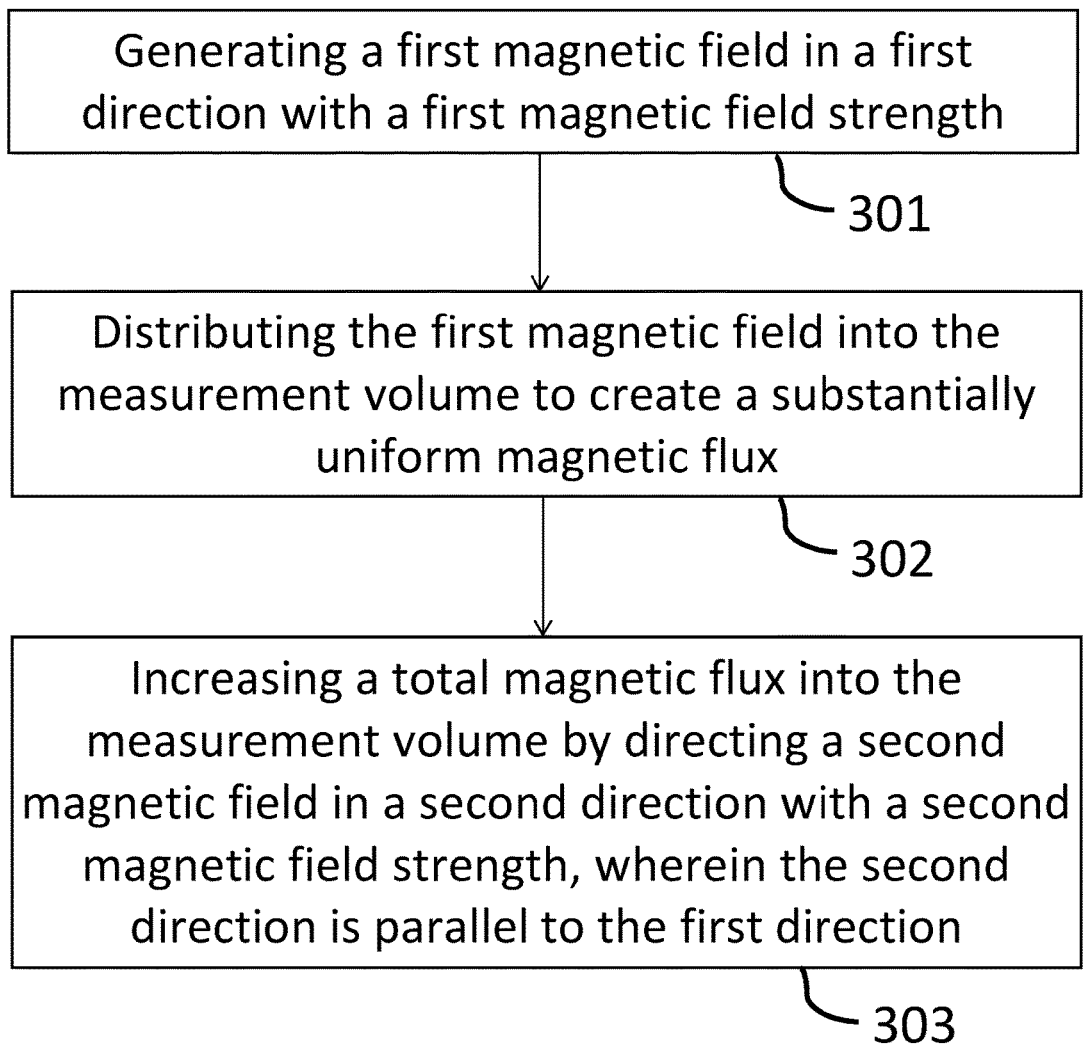
FIG. 3 shows a flow chart for a method of directing magnetic fields into a measurement volume, according to illustrative embodiments of the invention.

Reference is now made to FIG. 3, which shows a flow chart for a method of directing magnetic fields into a measurement volume, according to some embodiments of the invention.

The method includes generating a first magnetic field in a first direction with a first magnetic field strength (Step 301). For example, the first and second magnets 201 and 221 as described above in FIG. 1B can direct a first magnetic field in a first direction and having first magnetic field strength.

The method can further include distributing the first magnetic field into the measurement volume to create a substantially uniform magnetic flux. (Step 302). For example, the first ferromagnetic element 202 and/or the second ferromagnetic element 222, as described above in FIG. 1B can distribute the first magnetic field into the measurement volume.

The method can further include increasing a total magnetic flux into the measurement volume by directing a second magnetic field in a second direction with a second magnetic field strength, where the second direction is parallel to the first direction (Step 303). For example, the third magnet 230 as described above in FIG. 1 can direct a second magnetic field in a second direction and having second magnetic field strength. In some embodiments, the method includes directing a third magnetic field in a third direction having a third magnetic field strength, wherein the third direction is perpendicular to the first direction. For example, the fifth magnets 203 and/or sixth magnets 223 as described above in FIG. 2 can direct a third magnetic field in a third direction and having third magnetic field strength.

In some embodiments, the method includes positioning an object within the measurement volume, and performing magnetic field analysis on the object (e.g., by using the magnetic device 200 within a NMR device and/or an MRI device).

In some embodiments, first, second and third magnetic fields are directed such that a desired magnetic field strength is achieved. The desired magnetic field strength can be based on a particular device performing the measurements and/or object to be measured. For example, the desired magnetic field strength can be between 0.5-1.5 T, for magnetic resonance imaging of living human tissue. As is apparent to one of ordinary skill in the art, the desired magnetic field strength shown is for exemplary purposes only, and that the desired magnetic field strengths can vary based on subject/application of the magnetic field.

In some embodiments, the first magnetic field strength and the first direction, and the second magnetic field strength and the second direction are based on a size of the measurement volume and/or type of object to be measured, and/or any combination thereof. In some embodiments, the total magnetic flux in the measurement volume can be a substantially homogeneous field.

Figure 4D:
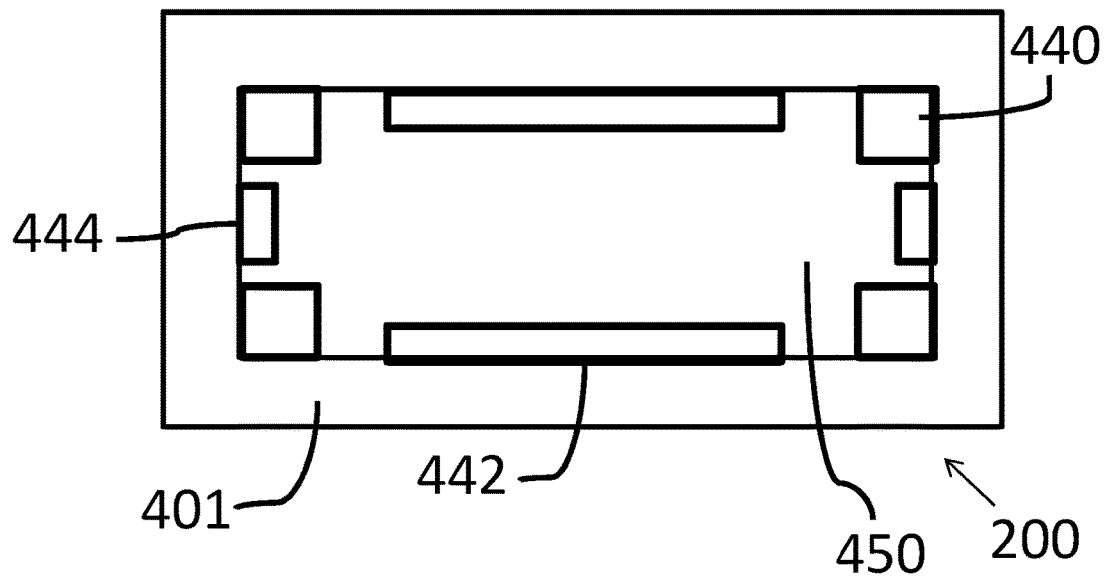

Reference is now made to FIGS. 4A-4H, which schematically illustrate a top cross-sectional view of some exemplary configurations for magnetic components of a magnetic field device (for example magnetic field device 200), according to some embodiments of the invention. FIG. 4A schematically illustrates a first exemplary configuration, where at least one third magnet 430 (similar to the third magnet 230, as shown in FIGS. 1-2) can be positioned adjacent to the first magnet 401 (similar to the first magnet 201, as shown in FIGS. 1-2), for example perpendicularly. Such positioning can be utilized to at least partially surround and/or envelope the gap 450 (similar to gap 250, as shown in FIGS. 1-2). In some embodiments, a plurality of the third magnets 430 can be utilized, wherein each third magnet 430 (e.g., main magnets) can have a different size and/or shape. In some embodiments, the fifth and sixth magnets can be positioned such that they do not physically contact the third magnets.

FIG. 4B schematically illustrates a first exemplary configuration, where at least one first intermediate magnet 432 (e.g., main magnet) can be positioned between two adjacent third magnets 430. FIG. 4C schematically illustrates a first exemplary configuration, where at least one second intermediate magnet 434 e.g., main magnet) can be positioned between adjacent third magnet 430 and first intermediate magnet 432. In some embodiments, at least one of first intermediate magnet 432 and/or second intermediate magnet 434 can be a permanent magnet.

According to some embodiments, an object (or a subject) can be introduced to the gap (or measurement region), for example in order to adjust an element therein, from any one of four possible directions due to, for example, the symmetry of the system. In some embodiments, access can also be provided for introduction of cameras, air conditioning and/or other equipment to be adjacent to the gap.

FIG. 4D schematically illustrates a first exemplary configuration, where at least one first intermediate magnet 442 can be positioned between two adjacent third magnets 440 and at least one second intermediate magnet 444 can be positioned between two adjacent third magnets 440. Different sizes and/or shapes of at least one first intermediate magnet 442 and at least one second intermediate magnet 444 can allow differentiation of the magnets, e.g., providing smaller magnets of different shapes at particular locations instead of single large magnet, in order to allow a desired magnetic flux within the gap 450. In case that shape symmetry about an axis through the center of the third magnet is broken, e.g., for magnetic shimming and/or for creation of an opening to allow access to the gap, other elements (e.g., permanent magnets) can be modified so as to maintain the predetermined magnetic field. In some embodiments, a break in symmetry, e.g., of the shape of the magnet, can require modification of the outer shell as well.

Figure 4E:
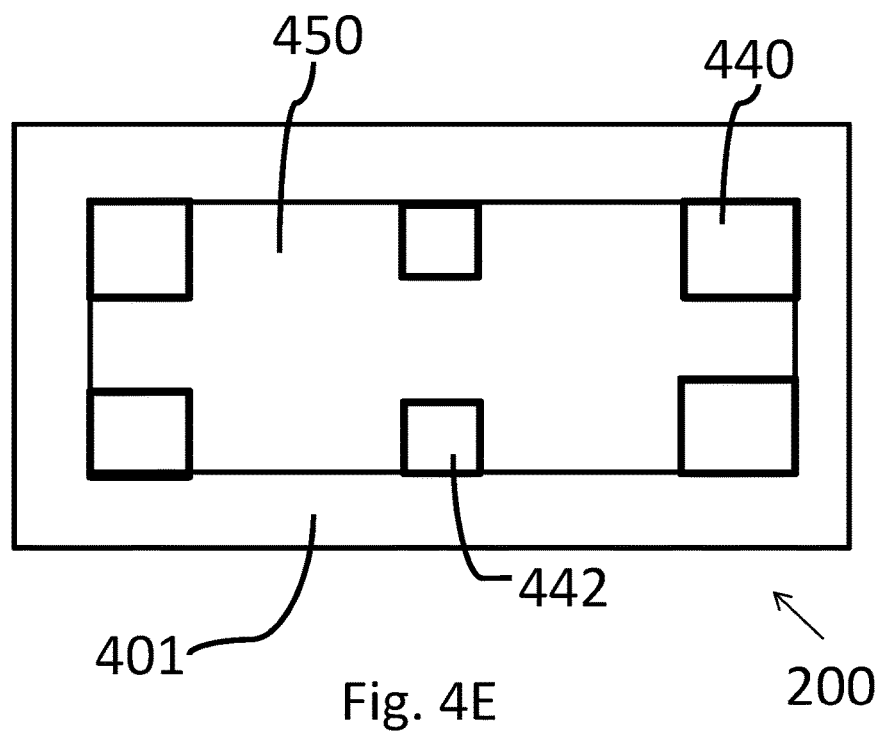
Figure 4F:
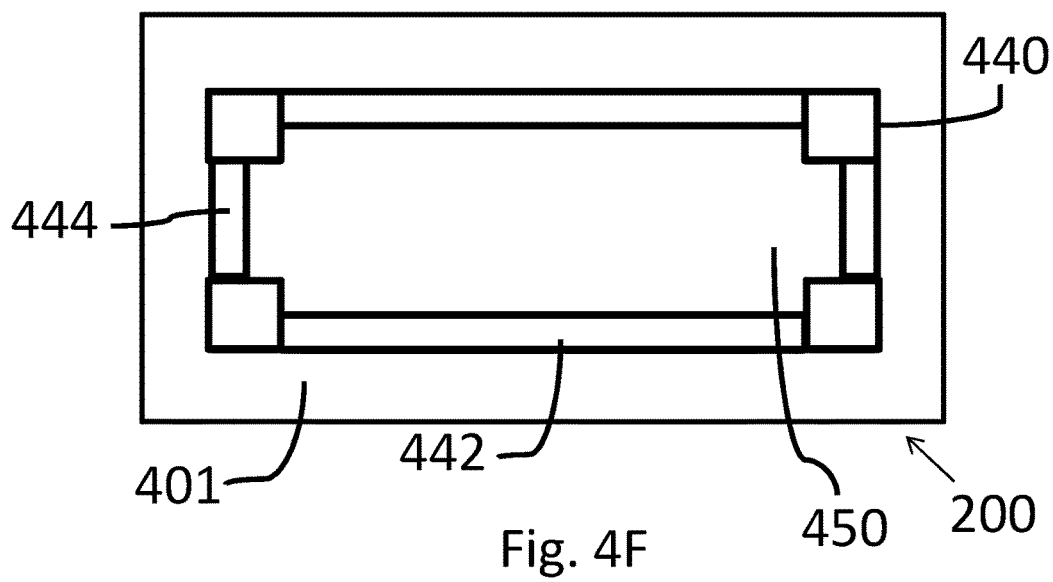

FIG. 4E schematically illustrates a first exemplary configuration, where at least one first intermediate magnet 442 can be positioned at a predetermined distance, based on the predetermined magnetic field strength, from the center of first magnet 401, in order to allow a desired magnetic flux within the gap 450. FIG. 4F schematically illustrates a first exemplary configuration, where at least one first intermediate magnet 442 can be positioned between two adjacent third magnets 440 and at least one second intermediate magnet 444 can be positioned between two adjacent third magnets 440. In some embodiments, addition of the at least one first intermediate magnet 442 can be configured to further support the structure of the system and/or to create at least a partial magnetic cage within the gap 450.

Figures 4G, 4H:
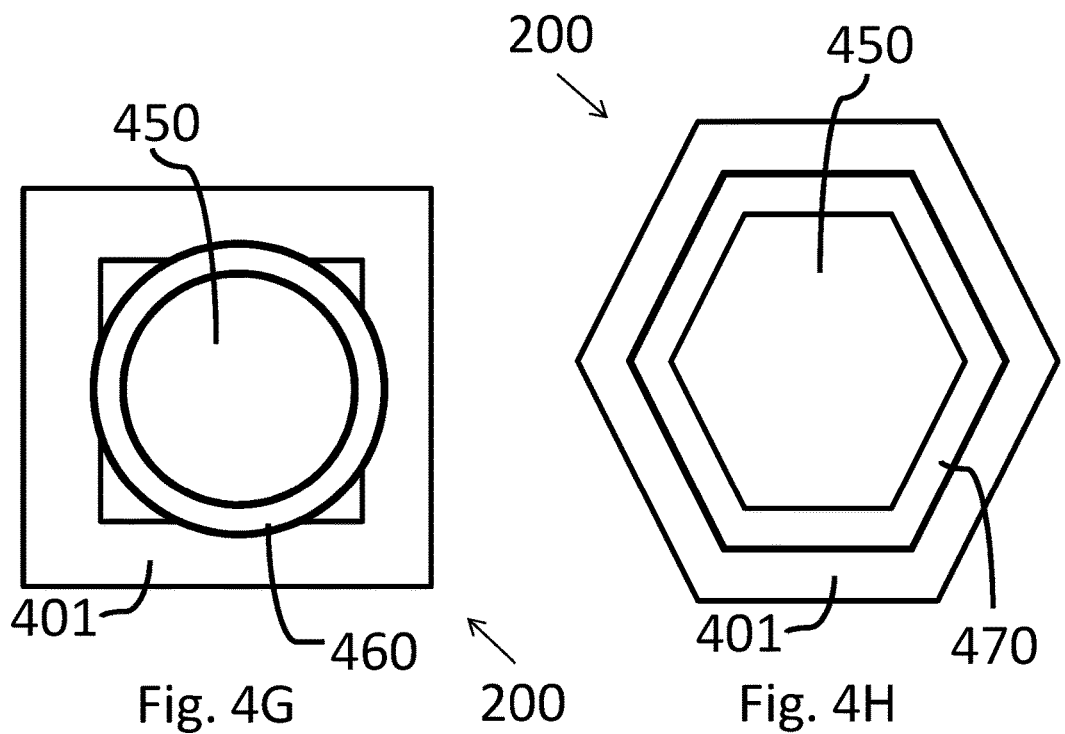

FIG. 4G schematically illustrates a first exemplary configuration, where a circularly shaped third magnet 460 can surround the gap 450. FIG. 4H schematically illustrates a first exemplary configuration, where or a hexagon shaped third magnet 470 can surround the gap 450. In some embodiments, an opening can be provided in a third magnet surrounding the gap 450 in order to allow insertion of an object therein.

Figure 5A:
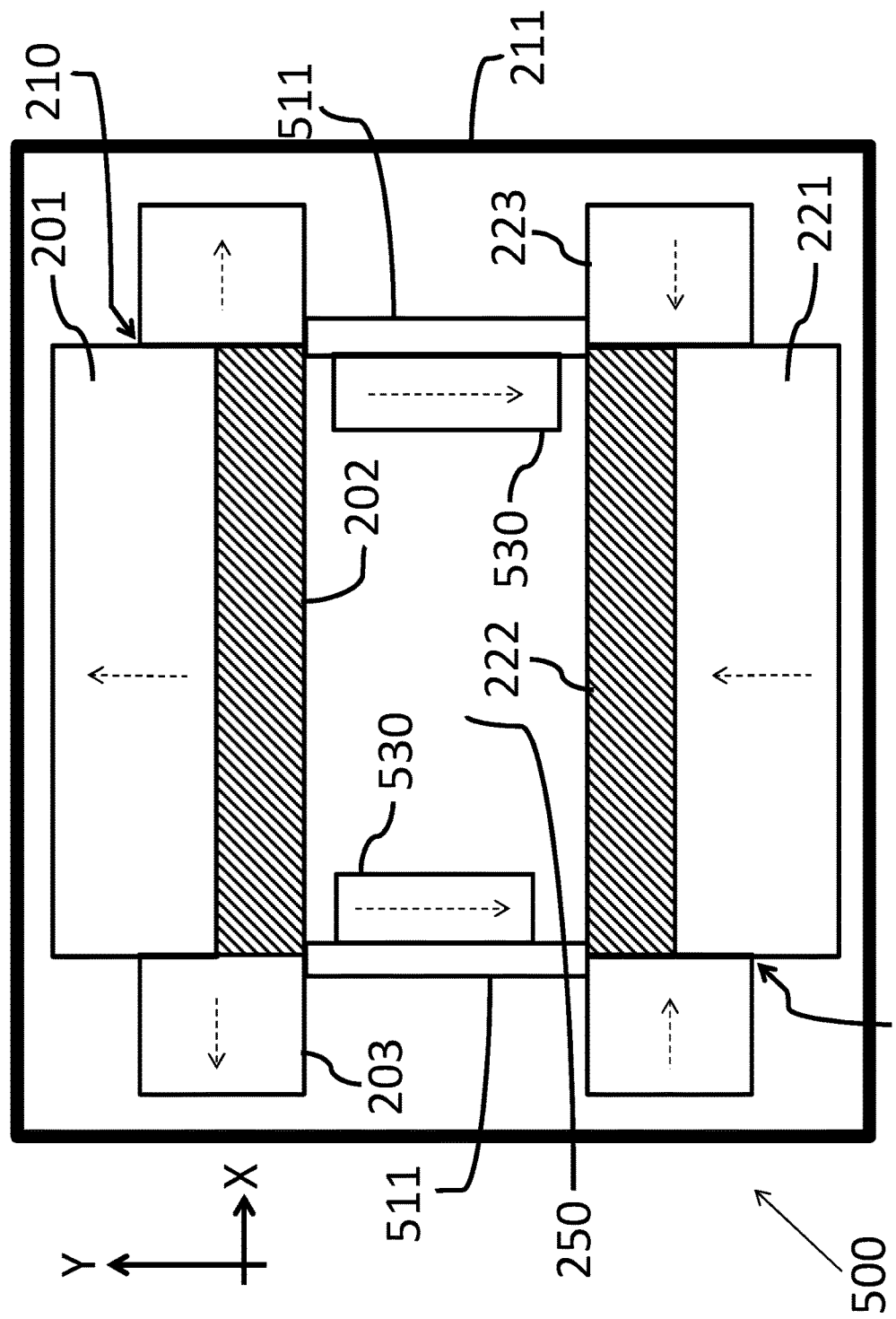
FIG. 5A schematically illustrates a frontal cross-sectional view of a magnetic field device, according to illustrative embodiments of the invention.
Figure 5B:
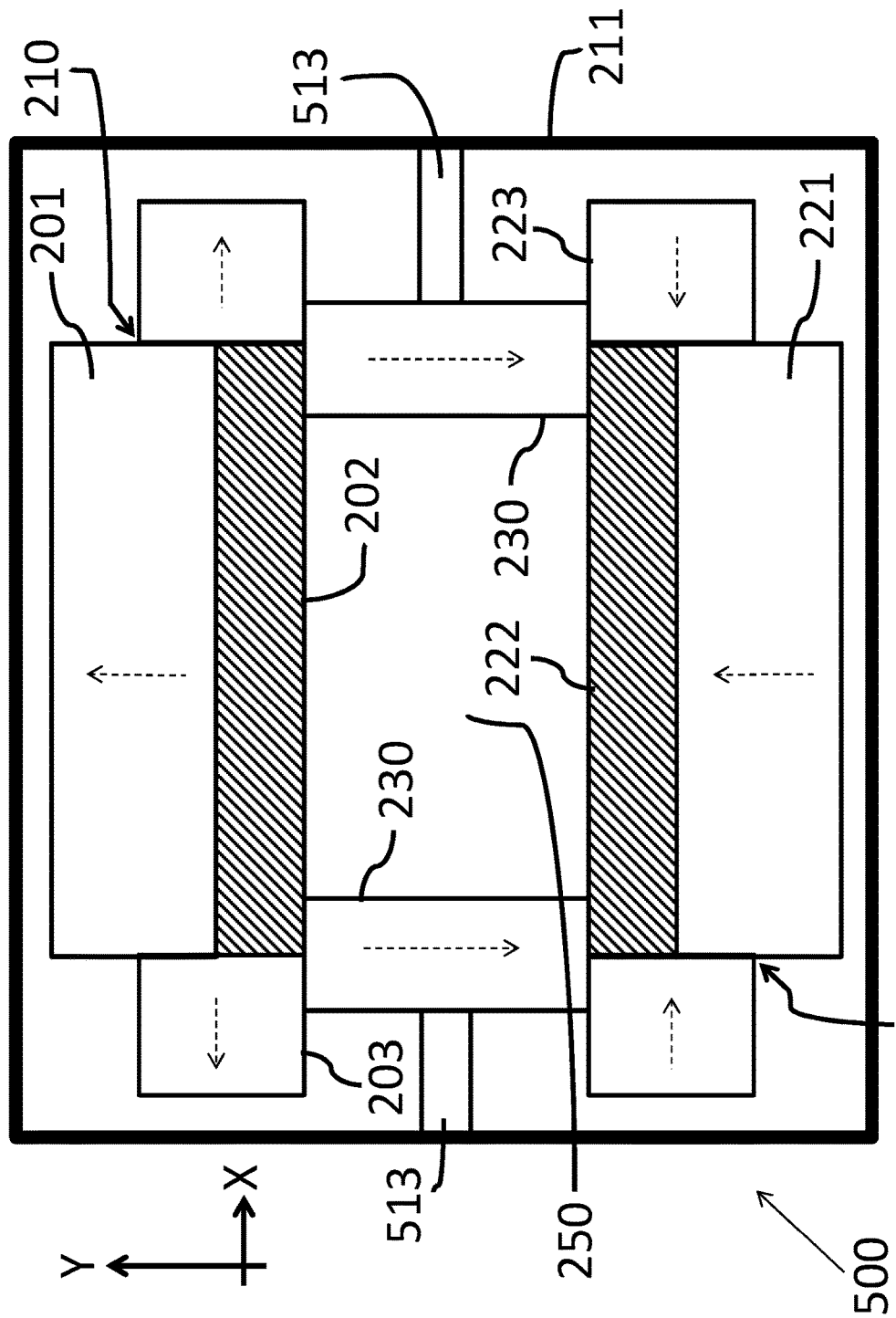
FIG. 5B schematically illustrates a frontal cross-sectional view of a magnetic field device, according to illustrative embodiments of the invention.

Reference is now made to FIGS. 5A-5B, which show the magnetic field device 500 (e.g., magnetic field device 200 as described above in FIG. 2) including support elements. FIG. 5A schematically illustrates a frontal cross-sectional view of a magnetic field device 500 having first support elements 511, according to some embodiments of the invention. It may be appreciated that the magnetic field device 500 can include all elements of the magnetic field device 200 (e.g., as shown in FIGS. 1-2) with the addition of at least one first support element 511 between the first ferromagnetic element 202 and the second ferromagnetic element 222.

According to some embodiments, at least one third magnet 530 can be added to a first support element 511 such that at least one air gap (not shown) can be created between the third magnet 530 and the first and/or second magnets 201, 221. In some embodiments, instead of air gaps, a gap of diamagnetic material can be formed therein.

FIG. 5B schematically illustrates a frontal cross-sectional view of a magnetic field device 500 having second support elements 513, according to some embodiments of the invention. It may be appreciated that the magnetic field device 500 can include all elements of the magnetic field device 200 (e.g., as shown in FIGS. 1-2) with the addition of at least one second support element 513. In some embodiments, the outer shell 211 (or envelope) can contact at least one third magnet 230 with at least one second support element 513 in order to support the positioning of the third magnets 230. It may be appreciated that such support of third magnets 230 can counter magnetic attraction forces acting on third magnets 230, such that third magnet 230 can remain in the desired position. In some embodiments, the at least one second support element 513 can couple the third magnets 230 with at least one of the outer shell 211 and first and second ferromagnetic elements 202, 222.

Figure 6:
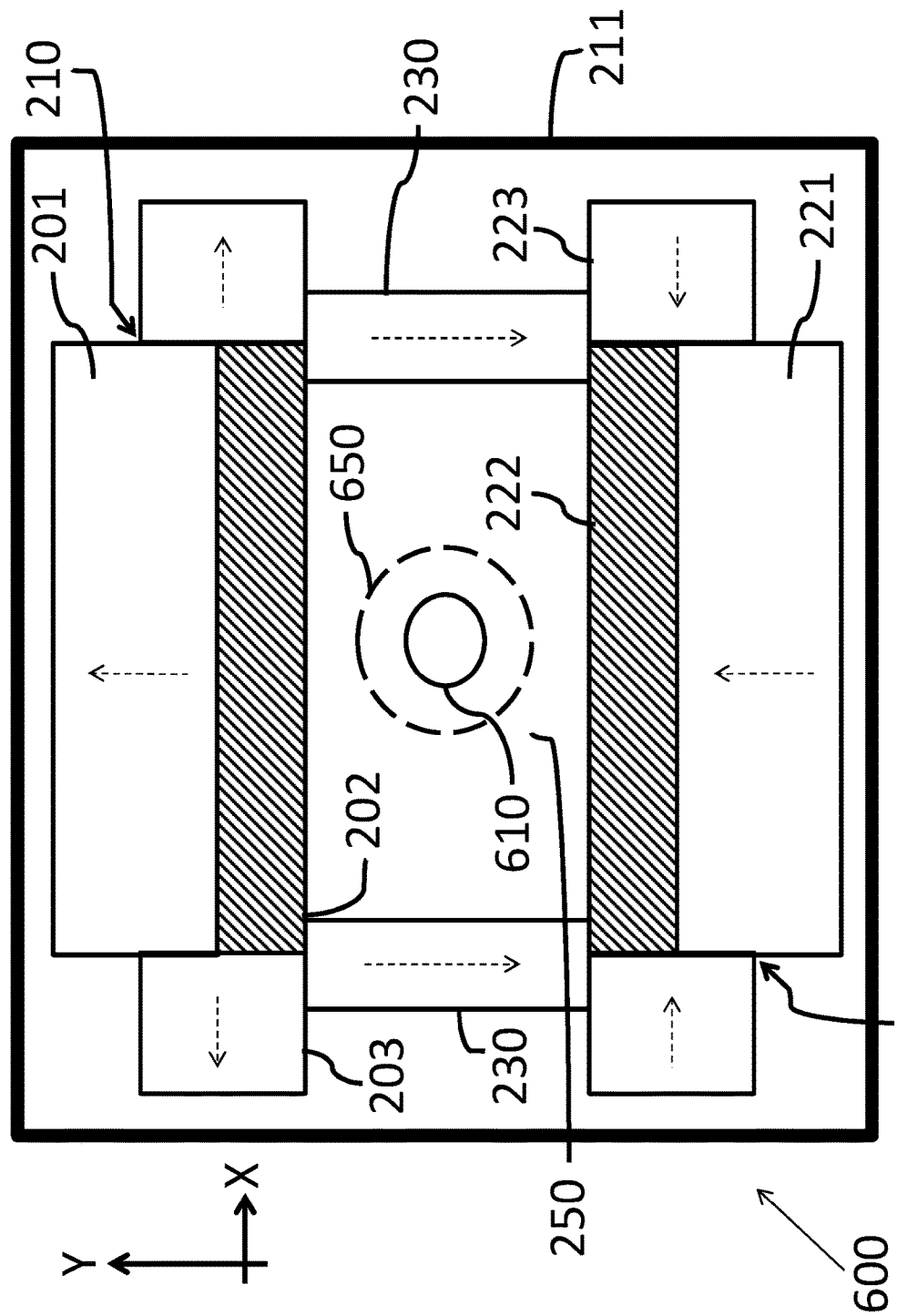
FIG. 6 schematically illustrates a frontal cross-sectional view of a head magnetic field device, according to illustrative embodiments of the invention.

Reference is now made to FIG. 6, which schematically illustrates a frontal cross-sectional view of a head magnetic field device 600, according to some embodiments of the invention. The head magnetic field device 600 includes a first magnet 201 and a first ferromagnetic element 202 coupled to the first magnet 201, and a second magnet 221 and a second ferromagnetic element 222 coupled to the second magnet 221. The first magnet 201 and the second magnet 221 can be positioned to create a gap 250 therebetween, with the first ferromagnetic element 202 and the second ferromagnetic element 222 positioned adjacent the gap 250 and between the gap 250 and a respective first magnet 201 and second magnet 221. The head magnetic field device 600 can also include an opening 650, the opening configured to allow, for example, at least partial accommodation of a head 610 of a patient within the gap 250 (or measurement volume). In some embodiments, head magnetic field device 600 can also include at least one third magnet 230. It may be appreciated that while the head 610 of the patient is described here, any other body part can be similarly introduced to the gap 250 for inspection, for example and arm or a leg.

In some embodiments, magnetic resonance imaging elements (e.g., RF coil) can be coupled to the head magnetic field device 600 in order to allow imaging the head 610 of the patient within the gap 250. In an exemplary embodiment, the magnetic field strength for such a head magnet is above 4900 Gauss or about 4988 Gauss. In an exemplary embodiment, the field of view for MRI imaging within the gap 250 is a sphere with a diameter of about 190 millimeters. In an exemplary embodiment, the diameter of the opening 650 to the gap 250 is above 660 millimeters or about 665 millimeters. In an exemplary embodiment, the dimensions for a permanent head magnet are 1226×1226×866 millimeters.

Unless explicitly stated, the method embodiments described herein are not constrained to a particular order in time or chronological sequence. Additionally, some of the described method elements can be skipped, or they can be repeated, during a sequence of operations of a method.

Various embodiments have been presented. Each of these embodiments can of course include features from other embodiments presented, and embodiments not specifically described can include various features described herein.

The invention claimed is:

1. A magnetic field device, comprising:
   a first magnet;
   a first ferromagnetic element positioned adjacent to the first magnet;
   a second magnet;
   a second ferromagnetic element positioned adjacent to the second magnet and relative to the first ferromagnetic element to create a gap between the first ferromagnetic element and the second ferromagnetic element;
   a third magnet positioned between the first ferromagnetic element and the second ferromagnetic element and within the gap; and
   a fourth magnet positioned between the first ferromagnetic element and the second ferromagnetic element and within the gap.

2. The magnetic field device of claim 1, wherein the third magnet has a first surface that faces a first surface of the first ferromagnetic element and a second surface that faces a first surface of the second ferromagnetic element.

3. The magnetic field device of claim 2, wherein the first surface of the third magnet abuts the first surface of the first ferromagnetic element and the second surface of the third magnet abuts the first surface of the second ferromagnetic element.

4. The magnetic field device of claim 2, wherein the third magnet has a dimension that allows the third magnet to translate between a first position and a second position, the first position being the first surface of the first ferromagnetic element, the second position being the first surface of the second ferromagnetic element.

5. The magnetic field device of claim 1, wherein the fourth magnet has a first surface that faces a first surface of the first ferromagnetic element and a second surface that faces a first surface of the second ferromagnetic element.

6. The magnetic field device of claim 1, wherein the fourth magnet has a dimension that allows the fourth magnet to translate between a first position and a second position, the first position being the first surface of the first ferromagnetic element, the second position being the first surface of the second ferromagnetic element.

7. The magnetic field device of claim 1, wherein the first magnet, the second magnet and the third magnet are permanent magnets, superconducting magnets, or resistive magnets.

8. The magnetic field device of claim 1, wherein the first magnet, the second magnet and the third magnet have dimensions that are based on a desired magnetic field strength, a type of object to be imaged, or any combination thereof.

9. The magnetic field device of claim 1, wherein the first magnet, the second magnet and the third magnet has a length between 10 and 1100 millimeters, a width between 10 and 300 millimeters, and a height between 45 and 200 millimeters.

10. The magnetic field device of claim 1, wherein the gap has dimensions that are based on a type of object to be imaged.

11. The magnetic field device of claim 1, wherein the gap has a diameter of 190 millimeters.

12. The magnetic field device of claim 1, further comprising at least one fifth magnet coupled to the first magnet.

13. The device of claim 1, wherein the third magnet is positioned to cause a decrease of a magnetic field that is peripheral to the magnetic field device.

14. The device of claim 1, wherein a first axis of the magnetic field device is defined as passing from the first ferromagnetic element to the second ferromagnetic element, wherein the first magnet and the second magnet are positioned to cause a magnetic field with a magnetization direction along the first axis, and wherein the third magnet is positioned to cause a magnetic field with a magnetization direction along the first axis.

15. The device of claim 14, wherein the magnetization direction of the third magnet is opposite of the magnetization direction of the first magnet.

16. The device of claim 1, wherein at least one of the first and second magnets emits a magnetic field with a predetermined magnetic field strength, wherein the third magnet emits a magnetic field with a predetermined magnetic field strength, and wherein the strength of the magnetic field of at least one of the first and second magnets is substantially greater than the strength of the magnetic field of the third magnet.

17. The device of claim 1, wherein the total magnetic field produced during operation of the magnetic field device is substantially homogeneous and uniform within the gap.

18. A magnetic field device, comprising:
a first magnet;
a first ferromagnetic element positioned adjacent to the first magnet;
a second magnet;
a second ferromagnetic element positioned adjacent to the second magnet and relative to the first ferromagnetic element to create a gap between the first ferromagnetic element and the second ferromagnetic element;
a third magnet positioned between the first ferromagnetic element and the second ferromagnetic element and within the gap, wherein the magnetic field device is positioned within an outer shell, the outer shell comprising a metal alloy.

* * * * *